United States Patent
Grosse et al.

(10) Patent No.: US 6,175,585 B1
(45) Date of Patent: Jan. 16, 2001

(54) ELECTRON BEAM SHIELDING APPARATUS AND METHODS FOR SHIELDING ELECTRON BEAMS

(75) Inventors: Ingo A. Grosse, Richland, WA (US); Leonard C. Hainz, II, Albany, OR (US); Mark A. Hall, Pasco, WA (US)

(73) Assignee: Oregon Metallurgical Corporation, Albany, OR (US)

( * ) Notice: Under 35 U.S.C. 154(b), the term of this patent shall be extended for 0 days.

(21) Appl. No.: 09/354,286

(22) Filed: Jul. 15, 1999

(51) Int. Cl.⁷ .................................................. H01J 37/305
(52) U.S. Cl. ........................... 373/10; 373/16; 219/121.21
(58) Field of Search .................. 313/10–16; 219/121.15, 219/121.16, 121.17, 121.21; 75/10.13

(56) References Cited

U.S. PATENT DOCUMENTS

| | | |
|---|---|---|
| Re. 32,932 | 5/1989 | Harket et al. . |
| Re. 35,024 | 8/1995 | Hanks . |
| 3,265,801 * | 8/1966 | Eaton ..................................... 373/14 |
| 3,303,320 * | 2/1967 | Muller .................................... 373/14 |
| 3,343,828 * | 9/1967 | Hunt ...................................... 373/16 |
| 3,857,014 | 12/1974 | Prudkovsky et al. . |
| 4,027,722 | 6/1977 | Hunt . |
| 4,932,635 | 6/1990 | Harker . |
| 5,034,590 * | 7/1991 | Yamamoto ....................... 219/121.15 |
| 5,100,463 * | 3/1992 | Harker ............................... 75/10.13 |
| 5,263,689 | 11/1993 | Menzies et al. . |
| 5,291,940 | 3/1994 | Borofka et al. . |

* cited by examiner

Primary Examiner—Tu Ba Hoang
(74) Attorney, Agent, or Firm—Patrick J. Viccaro

(57) ABSTRACT

Apparatus and methods for limiting interaction of electron beams produced by adjacent electron bean guns mounted within a vacuum chamber of a furnace. The apparatus may include one or more barriers that are suspended within the vacuum chamber between adjacent electron beam guns. The methods may include suspending one or more vertically extending barriers with the vacuum chamber between adjacent electron beam guns.

52 Claims, 5 Drawing Sheets

ELECTRON BEAM SHIELDING APPARATUS AND METHODS FOR SHIELDING ELECTRON BEAMS

CROSS-REFERENCE TO RELATED APPLICATIONS

Not applicable.

FEDERALLY SPONSORED RESEARCH

Not applicable.

BACKGROUND OF THE INVENTION

Field of the Invention

The subject invention relates to electron beam furnaces for processing metallic materials and, more particularly, to apparatuses and methods for controlling and limiting the interaction of electron beams generated by adjacent electron beam guns mounted within an electron beam furnace.

DESCRIPTION OF THE INVENTION BACKGROUND

A variety of different processes and apparatuses have been developed over the years for obtaining relatively pure metals or alloys. One such apparatus that has been developed to separate the slag and burn off or evaporate volatile impurities from molten metal material is known as an electron beam furnace. Such furnaces are disclosed, for example, in U.S. Pat. No. 4,027,722 to Hunt and U.S. Pat. No. 4,932,635 to Harker.

In general, an electron beam furnace includes a vacuum chamber that has a hearth and crucible system therein. A number of electron beam guns are typically mounted in the vacuum chamber above the hearth to melt metals that are introduced into the chamber. As the metal is melted, it flows into the crucible to be re-solidified into an ingot. The electron beam from each gun can be deflected and scanned over the surfaces of the metal. The deflection of the electron beam is typically controlled by computers and electromagnetic coils in the base of each electron beam gun which serve to deflect the beam in accordance with changes in the magnetic fields. The use and construction of such electron beam guns are known in the art as exemplified by those electron beam guns disclosed in U.S. Pat. No. 3,857,014 to Prudkovsky et al. and U.S. Pat. No. RE 35,024 to Hanks.

The generation of electron beams by multiple electron beam guns in close proximity to each other can result in undesirable electromagnetic interaction between the beams. Changes in deflection or beam power of one gun can cause a change of deflection in an adjacent gun, which also influences the gun adjacent to it and so on. That interaction can make it difficult to control the beams to obtain the desired result. In addition, because the interaction of the electron beams is largely a function of the location of the electron beam guns relative to each other within the vacuum chamber, the further away from the metal that the electron guns are located, the greater the likelihood of electron beam interaction. Thus, the size of the vacuum chamber is often dictated by the number and location of electron beam guns. Small vacuum chambers require more frequent cleaning to remove the buildup of condensate material therein that could hamper and possibly lead to contamination of the material passing therein.

Thus, there is a need for apparatuses and methods for limiting the interaction between beams of adjacently mounted electron beam guns.

There is a further need for apparatuses and methods for improving the ability to control electron beam guns within an electron beam furnace.

There is still another need for apparatus having the above-mentioned advantages that is relatively inexpensive to manufacture and install.

Another need exists for an electron beam furnace that has means for limiting the interaction between the beams generated by electron beam guns mounted therein.

SUMMARY OF THE INVENTION

In accordance with a particularly preferred form of the present invention, there is provided an apparatus for limiting interaction between beams generated by at least two electron beam guns mounted within an electron beam furnace having a superstructure. The apparatus may include a planar barrier sized to extend between at least two electron beam guns and a superstructure hanger connected to the planar barrier.

The subject invention may also comprise an electron beam furnace that includes a vacuum chamber that has an upper portion and a lower portion. The furnace also has a hearth assembly located within the lower portion of said vacuum chamber and at least two electron beam guns mounted within the vacuum chamber above the hearth assembly. In addition, the furnace includes at least one planar barrier suspended from the upper portion of the vacuum chamber such that it extends between at least two electron beam guns.

The subject invention may also comprise a method for limiting interaction between electron beams generated by at least two electron beam guns within a vacuum chamber of an electron beam furnace. The method includes suspending a barrier from an upper portion of the vacuum chamber such that the barrier extends between the electron beams produced by the electron beam guns.

It is a feature of the present invention to provide magnetic shield barriers within an electron beam furnace to limit undesirable interaction between the beams of adjacent guns.

It is another feature of the present invention to provide magnetic shield barriers that are relatively inexpensive to manufacture and install.

Yet another feature of the present invention is to provide magnetic shield barriers that enable the electron beam guns to be positioned farther from their targets which enables larger vacuum chambers to be employed in electron beam furnaces. Larger chambers reduce the frequency of clean-outs required because the condensate collection can be placed further away from the melting process and can be provided with a larger surface area which results in a slower buildup of condensate.

Accordingly, the present invention provides solutions to the shortcomings of prior furnaces that employ electron beam guns. Those of ordinary skill in the art will readily appreciate, however, that these and other details, features and advantages will become further apparent as the following detailed description of the preferred embodiments proceeds.

BRIEF DESCRIPTION OF THE DRAWINGS

In the accompanying Figures, there are shown present preferred embodiments of the invention wherein like reference numerals are employed to designate like parts and wherein.

DETAILED DESCRIPTION OF THE PREFERRED EMBODIMENTS

Figure 1:
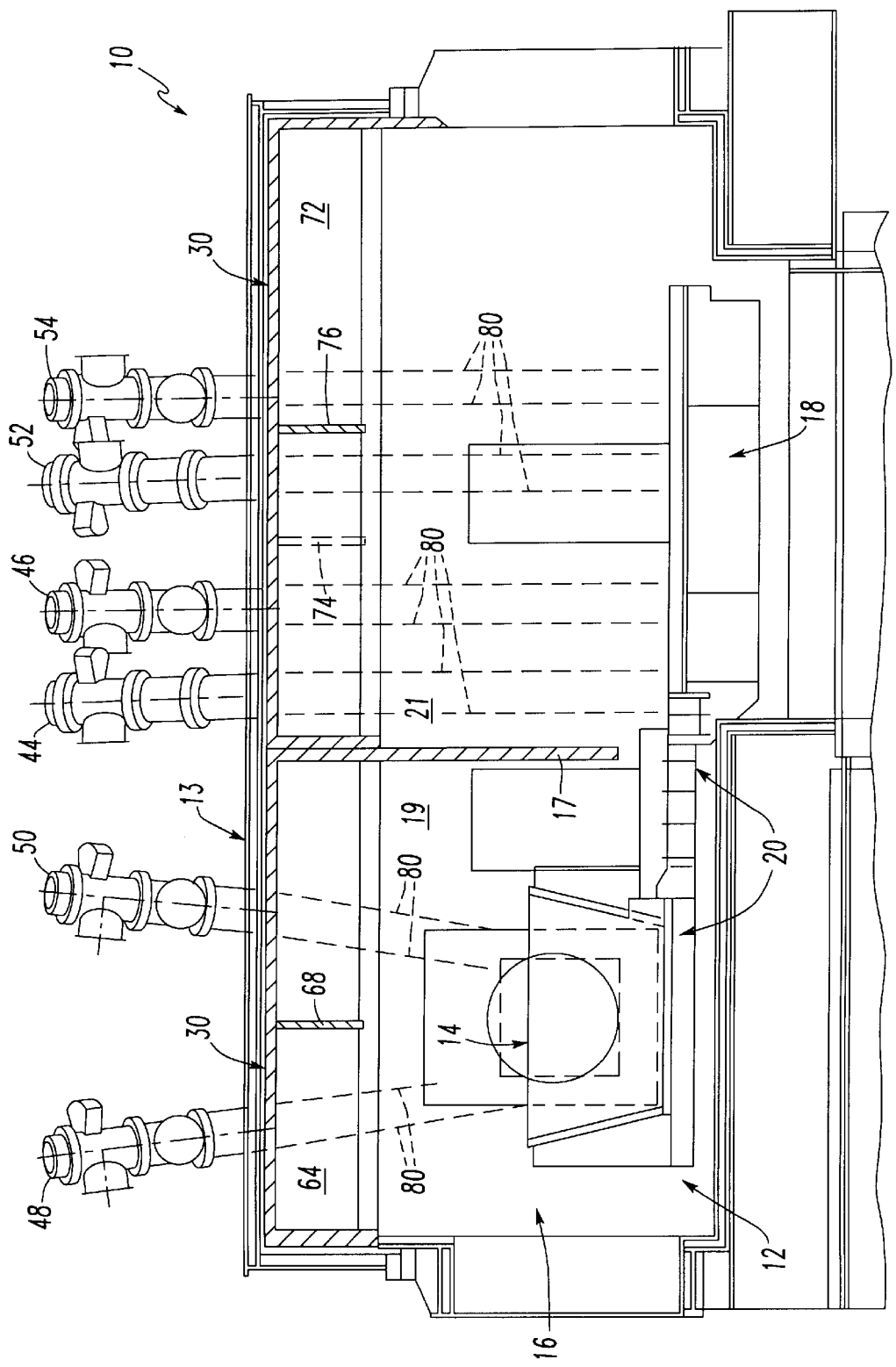
FIG. 1 is a partial cross-sectional elevational view of a portion of an electron beam furnace employing shield assemblies of the present invention.
Figure 2:
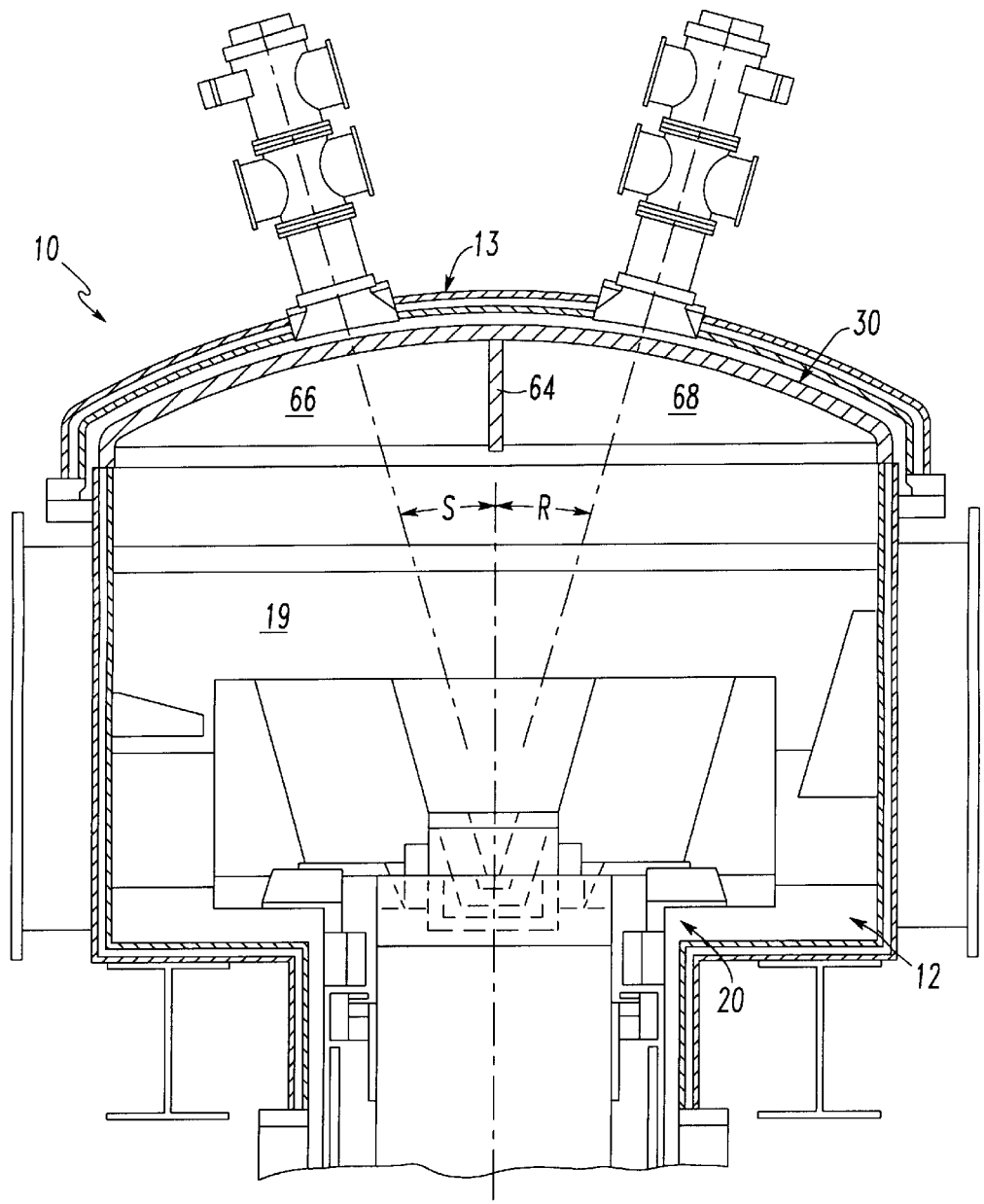
FIG. 2 is a partial cross-sectional end view of the furnace of FIG. 1.
Figure 3:
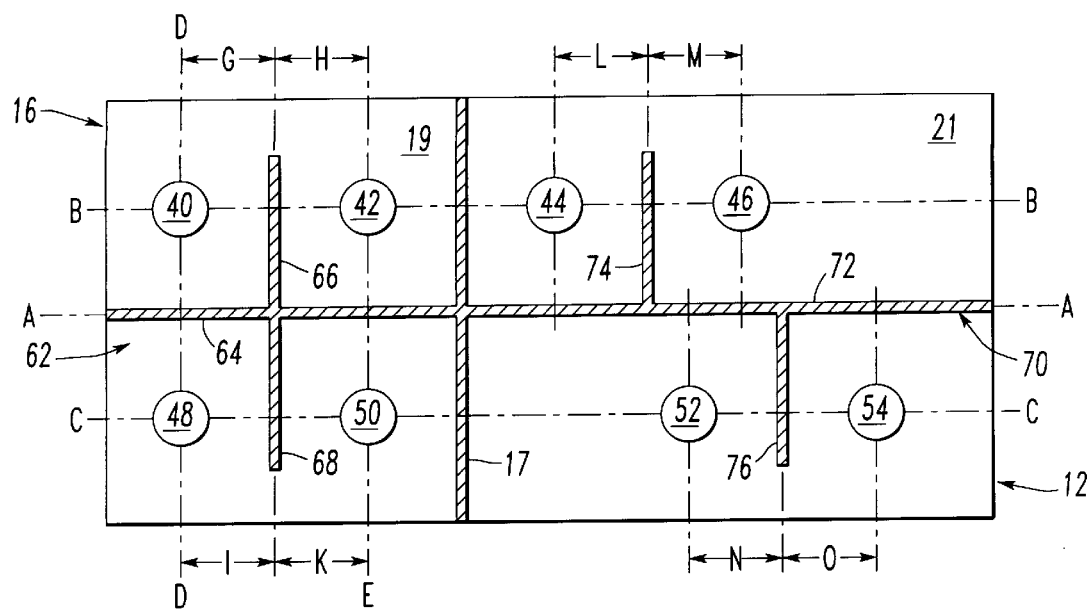
FIG. 3 is a partial plan view of the furnace of FIGS. 1 and 2, illustrating the orientation of the shield assemblies relative to the electron beam guns.

Referring now to the drawings for the purposes of illustrating the present preferred embodiments of the invention only and not for the purposes of limiting the same, FIGS. 1–3 show an electron beam furnace 10 for melting metals that has a shield assembly 60 of the present invention installed therein. Those of ordinary skill in the art will appreciate that the shield assembly 60 may be successfully employed in connection with a variety of different electron beam furnace configurations. Thus, the present invention should not be limited to use only in connection with furnaces that are constructed the manner depicted in the present Figures and described herein.

More specifically and with reference to FIGS. 1 and 2, the furnace 10 includes a vacuum chamber 12 that has a hearth assembly 20 extending therethrough. The vacuum chamber 12 has an entry end 14 into which raw material is introduced, a melting zone 16, and a crucible mold 18. In practice, molten material flows along the hearth assembly 20 under the influence of gravity. Raw material is introduced into the entry end 14. The raw material is melted by bombarding it with beams of charged particles from a series of electron beam guns (40, 42, 44, 46, 48, 50, 52, 54) mounted within the vacuum chamber 12 above the hearth assembly 20. The molten material flows in one continuous path through the hearth assembly 20 into the crucible mold 18. It will be understood that by heating the molten material flowing along the hearth assembly 20 and by maintaining a relatively high vacuum, various volatile impurities and occluded gases emitted from the molten metal are exhausted from the chamber 12 through the vacuum pumps (not shown) servicing the chamber 12. Thus, the molten material is purified as it flows through the melting zone 16 such that it achieves the desired level of purity when it reaches the crucible mold 18. From the crucible mold 18, the molten material is then continuously cast into a cold mold or the like in a casting zone which facilitates the continuous egress of material from the furnace in the form of, for example, metal ingots.

As the molten metal is heated within the processing zone, some metal is deposited on the interior walls and structures within the vacuum chamber 12. After a predetermined period of time, the process must be interrupted to permit cleaning of the vacuum chamber 12. The vacuum chamber 12 is typically provided with a series of condensate frame assemblies 30 that are supported from the upper superstructure 13 of the vacuum chamber 12. See FIGS. 1 and 2. Such condensate frame assemblies 30 may be fabricated from, for example, mild steel and have a series of screens, plates, etc. that provide surfaces upon which the molten metal may adhere. Removing the excess material from the condensate frame assembly 30 can be an arduous task. Often times the excess material must be chiseled or ground from the condensate screens. Thus, to minimize the amount of downtime associated with cleaning the vacuum chamber 12, the condensate frame assemblies 30 are typically constructed so that they may be removed from the vacuum chamber 12 and replaced with clean frame assemblies 30 to permit the contaminated frame assemblies 30 to be cleaned off line.

As discussed above, a series of conventional electron beam guns are mounted above the hearth assembly 20 to direct electron particle beams onto the molten material thereon. The furnace 10 depicted in FIGS. 1–3 has a total of eight conventional electron beam guns (40, 42, 44, 46, 48, 50, 52, 54) mounted thereto. The skilled artisan will of course appreciate, however, that the shield assembly 60 of the present invention may be advantageously employed in furnaces that have at least two electron beam guns mounted in adjacent relationship to each other such that the beams from the guns may interact with each other. Therefore, the shield assembly 60 of the present invention should not be limited to use in connection with furnace arrangements that employ eight electron beam guns.

FIGS. 2 and 3 illustrate the layout of the electron beam guns (40, 42, 44, 46, 48, 50, 52, 54) in this embodiment. FIG. 3 is a plan view of the melting zone 16 of the vacuum chamber 12. As can be seen therein, a barrier wall 17 separates the melting zone 16 into a first zone 19 and a second zone 21 and the center of the melting zone 16 is defined by axis A—A. Conventional electron beam guns (40, 42, 44, 46) are equally spaced along an axis B—B within the chamber 12. Axis B—B is substantially parallel to axis A—A. Likewise, conventional electron beam guns (48, 50, 52, 54) are equally spaced along an axis C—C that is substantially parallel to axes A—A and B—B. Furthermore, in this embodiment, the centers of guns (40, 48) are aligned on an axis D—D that is substantially transverse to axis A—A. The centers of guns (52, 54) are aligned on an axis E—E that is also substantially transverse to axis A—A. The centers of guns (44, 46) are offset from the centers of guns (52, 54).

One embodiment of the shield assembly 60 of the present invention is depicted in FIGS. 2 and 3. As can be seen in FIG. 3, the shield assembly 60 comprises a first assembly 62 that is adapted to be mounted within the first melting zone segment 19 and a second assembly 70 that is adapted to be mounted within the second melting zone segment 21. First assembly 62 comprises a first longitudinal planar barrier 64 that may be fabricated from mild steel. A first transverse barrier 66, fabricated from mild steel may be attached to the first longitudinal barrier 64 by, for example, welding. As can be seen in FIG. 3, the first transverse barrier member 66 may be centrally disposed between guns (40, 42) (i.e., distance "G" equals distance "H"). First assembly 62 may further comprise a second transverse barrier member 68 fabricated from mild steel that may be attached to the first longitudinal barrier member 62 by, for example, welding such that it is centrally disposed between the guns (48, 50) when installed (i.e., distance "I" equals distance "K"). As can be seen in FIG. 2, the first and second transverse barriers (66, 68) are configured to substantially conform to the contour of the corresponding ceiling portion 13 of the vacuum chamber 12 and the corresponding condensate frame assembly 30. The first shield segment 62 may be suspended from the corresponding condensate frame assembly with chain or wire. Those of ordinary skill in the art will appreciate that the first shield assembly 62 may be attached to the corresponding condensate frame assembly 30 by bolted connections or other mechanical fasteners and connections. In addition, it will be further appreciated that the first transverse barrier 66 and the second transverse barrier 68 do not have to be attached to the longitudinal barrier 62. Instead, the first transverse barrier 66 and the second transverse barrier 68 may be separately suspended or otherwise attached to the condensate frame assembly 30.

The second shield assembly 70 is adapted to be mounted within the second melting zone segment 21 and comprises a second longitudinal barrier 72 that may be fabricated from, for example, mild steel. A primary transverse barrier 74, fabricated from, for example, mild steel may be attached to the second longitudinal barrier 72 by, for example, welding. As can be seen in FIG. 3, the primary transverse barrier 74 may be centrally disposed between guns (44,46) (i.e., distance "L" equals distance "M"). The second shield assembly 70 may further comprise a secondary transverse barrier member 76 fabricated from mild steel that may be attached to the second longitudinal barrier member 72 by, for example, welding such that it is centrally disposed between the guns (52, 54) when installed (i.e., distance "N" equals distance "O"). The primary and secondary transverse barriers (74, 76) are configured to substantially conform to the contour of the corresponding ceiling portion 13 of the vacuum chamber 12 and the corresponding condensate frame assembly 30. The second shield assembly 70 may be suspended from the corresponding section of the condensate frame assembly 30 with chain, wire or other suitable material. Those of ordinary skill in the art will appreciate that the second shield assembly 70 may also be attached to the corresponding portions of condensate frame assembly 30 by bolted connections or other mechanical fasteners and connections. In addition, it will be further appreciated that the primary transverse barrier 74 and the secondary transverse barrier 76 do not have to be attached to the second longitudinal barrier 72. Instead, the primary transverse barrier 74 and the secondary transverse barrier 76 may be separately suspended or otherwise attached to the condensate frame assembly 30. It will be further appreciated, however, that, in those furnace applications lacking the transverse barrier 17, the first and second longitudinal barriers (62, 72) may comprise a unitary member.

As can be seen in FIG. 2, the electron beam guns (42, 44, 46, 48, 50, 52, 54) emit beams of electron particles generally designated as 80. In this embodiment, the barriers (64, 66, 68, 72, 74, 76) extend downward toward the hearth assembly 20 from the condensate frame assembly 30 a distance of approximately 18 inches (45.7 cm)(represented by arrow "P" in FIG. 1). Those of ordinary skill in the art will appreciate that the distance that the shield assembly 60 protrudes downward is a function of the orientation of the electron beam guns. It is desirable for the shield assembly 60 to extend downward from the condensate shield assembly 30 as far as possible to minimize the amount of interaction between the beams 80 of adjacent guns, but not so far such that the beams 80 begin to degrade and/or melt the barriers (64, 66, 68, 72, 74, 76). Such distance may be determined by installing plates of various sizes between the adjacent guns to determine the maximum distance that the barriers can extend without being degraded or melted. In the embodiment depicted in FIGS. 1 and 2, the distance "P" is approximately 18 inches (45.7 cm). Angle "R" is approximately 15° and angle "S" is approximately 15°. It is conceivable, however, that other distances and angles may be successfully employed.

Figure 4:
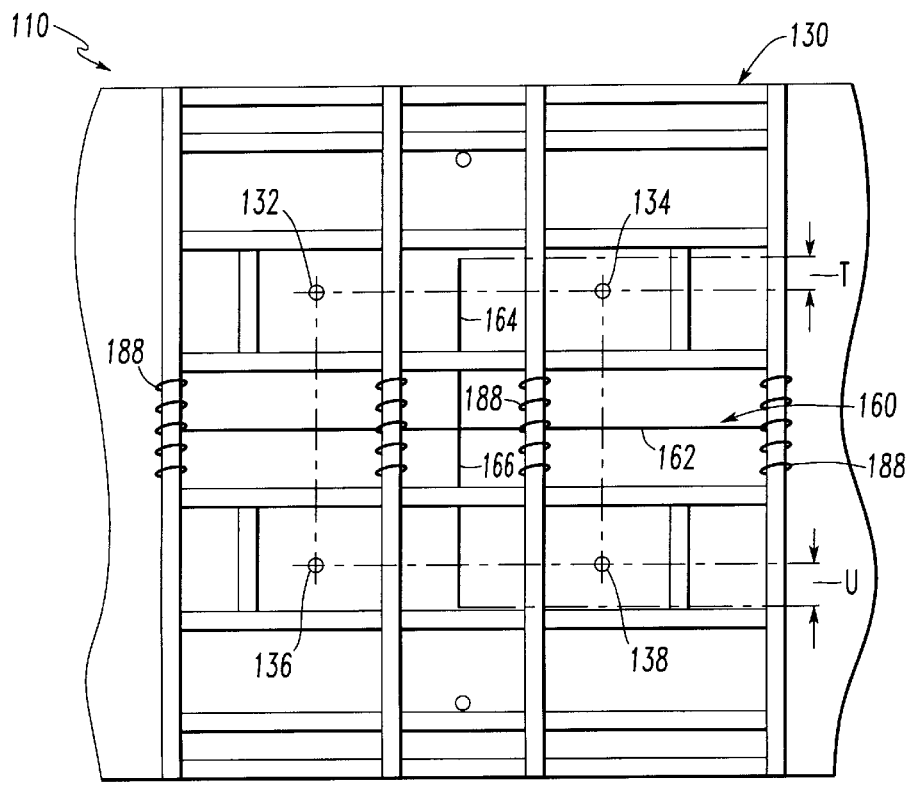
FIG. 4 is a partial plan view of another electron beam furnace employing another shield assembly embodiment of the present invention.
Figure 5:
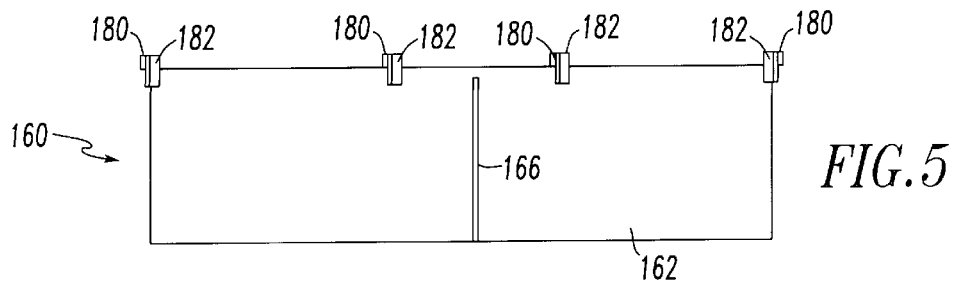
FIG. 5 is a side elevational view of the shield assembly depicted in FIG. 4.
Figure 6:
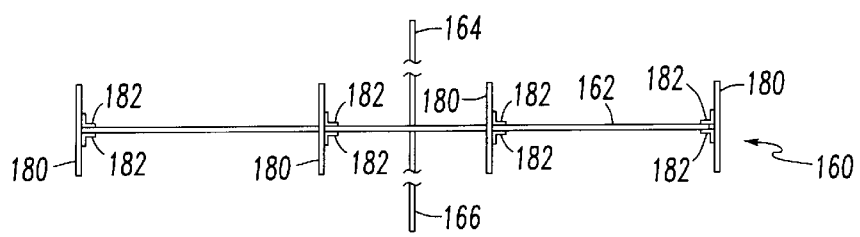
FIG. 6 is a top view of the shield assembly of FIG. 5.
Figure 7:
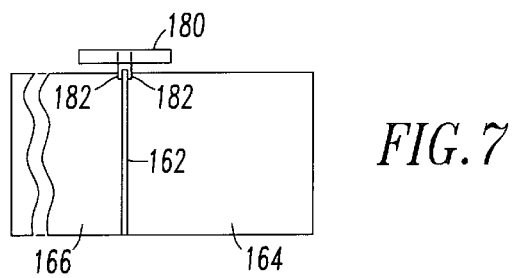
FIG. 7 is an end view of the shield assembly of FIGS. 5 and 6.
Figure 8:
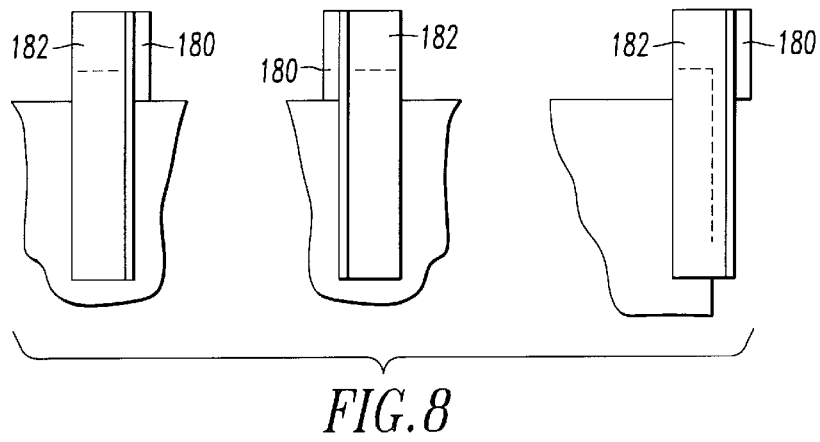
FIG. 8 is an enlarged partial view showing the struts of the shield assembly attached to the longitudinal barrier.

Another embodiment of the shield assembly of the present invention is depicted in FIGS. 4–9. FIG. 4 is a plan view of a portion of a condensate frame assembly 130 of an electron beam furnace 110 that corresponds to a section of the furnace that has four electron beam guns. Thus, the condensate frame assembly 130 has four gun ports (132, 134, 136, 138) therein. As can be seen in FIGS. 4–7, this embodiment of the shield assembly 160 comprises a longitudinal barrier 162 that is fabricated from, for example, mild steel. Also in this embodiment, first and second transverse plates (164, 166) may be attached together by, for example, welding to opposing sides of the longitudinal barrier 162. It will be appreciated, however, that the first and second transverse plates (164, 166) do not have to be attached to the longitudinal barrier, but may be separately suspended or otherwise attached to the condensate frame assembly 130. When installed, the longitudinal barrier 162 is centrally disposed between the gun ports (132, 134) and the gun ports (136, 138). The first and second transverse plates (164, 166) are centrally disposed between ports (132, 136) and ports (134, 138), respectively. See FIG. 4. The end of the first transverse plate 164 may be approximately six inches (15.24 cm) from the centerlines of gun ports (132, 134) (distance "T") and the end of the second transverse barrier 166 may be approximately six inches (15.24 cm) from the centerlines of the gun ports (136, 138) (distance "U").

To facilitate removable attachment to the condensate frame assembly 130, superstructure hangers in the form of transverse hanger struts 180 fabricated from, for example, mild steel, are attached to the longitudinal barrier 162 by pieces of steel angle 182 welded thereto. Those of ordinary skill in the art will appreciate that the hanger struts 180 may be attached to the longitudinal barrier 162 by a variety of different methods without departing from the spirit and scope of the present invention. The struts 180 are oriented to correspond with cross members of the condensate frame assembly 130 to enable the struts 180 to be removably affixed thereto by chain or wire 182. However, the struts 180 may be attached to the condensate frame assembly 130 or the vacuum chamber 112 by any suitable means including bolting, clamping, welding, etc.

Figure 9:
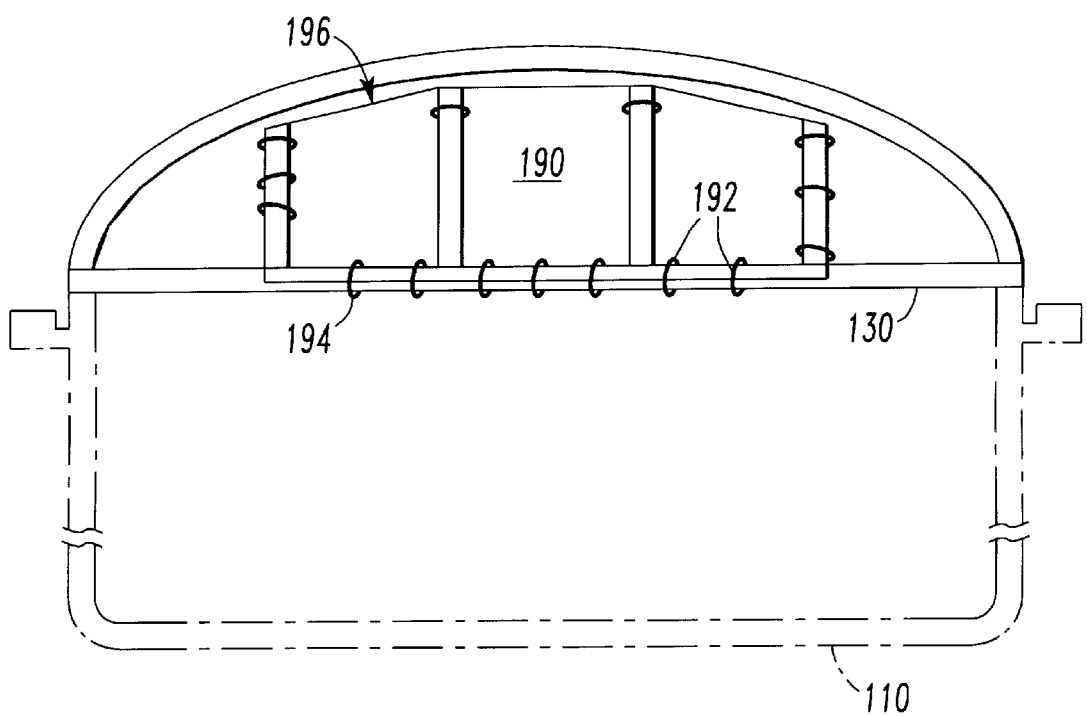
FIG. 9 is an end elevational view of the furnace of FIG. 4, showing a transverse endplate of the subject invention attached to the condensate assembly of the furnace.

As can be seen in FIG. 9, additional barrier plates 190 may be affixed to each end of the frame assembly 130. To facilitate such attachment, a series of holes 192 may be provided through the plate 190 to enable the plate 190 to be wired or chained to the frame assembly 130 by attachment members 194. The plate 190 may, however, be attached to the condensate frame assembly or vacuum chamber superstructure 13 by a variety of different fastening methods such as bolting or welding. As can also be seen in FIG. 9, the plates 190 may be provided with a relatively arcuate upper edge 196 to enable the plates to conform to the shape of the upper portion of the vacuum chamber 112 or the condensate frame assembly 130. In that embodiment, the bottom of the barrier plate 190 coincides with the bottom of the condensate frame assembly 130.

Thus, from the foregoing discussion, it is apparent that the present invention may be used in connection with a variety of different electron beam furnaces. The subject invention may be advantageously adapted to limit interaction of electron beams emitted from adjacent electron beam guns mounted within a furnace. In addition, because the shield assemblies are removably attached to the condensate screen assemblies, they can be easily removed therefrom for cleaning purposes. It will be understood, however, that the shield assemblies of the present invention may be non-removably affixed to the condensate screen assembly or to the vacuum chamber itself, if so desired.

Accordingly, the present invention represents an easy and inexpensive method of limiting interaction of electron beams in an electron beam furnace. Those of ordinary skill in the art will, of course, appreciate that various changes in the details, materials and arrangement of parts which have been herein described and illustrated in order to explain the nature of the invention may be made by the skilled artisan within the principle and scope of the invention as expressed in the appended claims.

What is claimed is:

1. An electron beam shield comprising:
    a vertically extending planar barrier sized to extend between at least two electron beam guns mounted within an electron beam furnace having a ceiling; and
    fastener chain attached to said planar barrier and said ceiling.

2. The shield of claim 1 wherein said planar barrier comprises a planar sheet fabricated from mild steel.

3. The shield of claim 1 wherein said planar barrier has a substantially arcuate upper edge.

4. Electron beam shielding apparatus comprising:
    a plate fabricated from mild steel and sized to extend between two electron beam guns mounted within an electron beam furnace having a ceiling;
    at least two cross braces affixed to an upper edge of said plate;
    at least one fastener hole in each of said cross braces; and
    a flexible fastener member corresponding to a fastener hole in a corresponding cross brace for attaching said corresponding cross brace to a portion of said ceiling.

5. An electron beam furnace comprising:
    a chamber means;
    hearth means in a bottom portion of said chamber means, said heath means supporting a raw material thereon;
    a plurality of electron beam generating means oriented above said hearth means for melting the raw material and creating a flow of molten raw material on said hearth means;
    means for establishing at least a partial vertically extending barrier between at least two said electron beam generating means, said means for establishing extending vertically downward from an upper portion of said chamber means such that said means for establishing does not extend into the flow of molten raw material on said hearth means.

6. An electron beam furnace, comprising:
    a vacuum chamber having an upper portion and a lower portion;
    a framework within said vacuum chamber;
    a hearth assembly within said lower portion of said vacuum chamber;
    at least two electron beam guns mounted within said vacuum chamber above said hearth assembly; and
    at least one planar barrier suspended from said framework by a flexible member and extending between at least two said electron beam guns.

7. The electron beam furnace of claim 6 wherein each said planar barrier comprises a plate fabricated from mild steel.

8. The electron beam furnace of claim 6 wherein each said planar barrier has at least two cross struts attached to an upper edge thereof and wherein said cross struts are wired to said framework.

9. The electron beam furnace of claim 6 wherein said furnace has first and second pairs of electron beam guns and wherein said planar barrier is centrally disposed between said first and said second pairs of electron beam guns.

10. A combination electron beam furnace and shielding apparatus comprising:
    a vacuum chamber having a longitudinally extending central axis;
    a first electron beam gun attached to said vacuum chamber on one side of said longitudinally extending central axis to emit a first beam of electron particles therein;
    a second electron beam gun attached to said vacuum chamber on another side of said longitudinally extending central axis to emit a second beam of electron particles therein;
    a vertically extending longitudinal barrier suspended within said vacuum chamber and extending between said first and second beams of electron particles.

11. The apparatus of claim 10 further comprising:
    a third electron beam gun mounted to said vacuum chamber to emit a third beam of electron particles therein; and
    a vertically extending first barrier attached to said longitudinal barrier and extending transversely therefrom between said first and third beams of electron particles.

12. The apparatus of claim 11 wherein said vertically extending longitudinal barrier and said vertically extending first barrier comprise planar plate members.

13. The apparatus of claim 12 wherein said planar plate members are fabricated from mild steel.

14. The apparatus of claim 11 further comprising:
    a fourth electron beam gun mounted to said vacuum chamber to emit a fourth beam of electron particles therein; and
    a second vertically extending barrier attached to said vertically extending longitudinal barrier and extending transversely therefrom between said second and fourth beams of electron particles.

15. The apparatus of claim 14 wherein said vertically extending longitudinal barrier is centrally disposed between said first and second beams of electron particles and said third and fourth beams of electron particles.

16. The apparatus of claim 10 further comprising:
    a fifth electron beam gun mounted to said vacuum chamber to emit a fifth beam of electron particles therein;
    a sixth electron beam gun mounted to said vacuum chamber to emit a sixth beam of electron particles therein; and
    a second vertically extending longitudinal barrier suspended within said vacuum chamber and extending between said fifth and six beams of electron particles.

17. The apparatus of claim 16 further comprising:
    a seventh electron beam gun attached to said vacuum chamber to emit a seventh beam of electron particles therein; and
    a primary barrier member affixed to said second longitudinal barrier and extending between said fifth and seventh beams of electron particles.

18. The apparatus of claim 17 further comprising:
    an eighth electron beam gun mounted to said vacuum chamber to emit an eighth beam of electron particles therein; and
    a secondary barrier member attached to said second vertically extending longitudinal barrier member and extending between said sixth and eighth beams of electron particles.

19. The apparatus of claim 18 wherein said primary barrier member is centrally disposed between said fifth and seventh beams of electron particles and wherein said secondary barrier member is centrally disposed between said sixth and eighth beams of electron particles.

20. The apparatus of claim 10 wherein said first electron beam gun and said second electron beam gun are aligned along a first transverse axis.

21. The apparatus of claim 11 wherein said first and third electron beam guns are aligned along a second longitudinal axis.

22. The apparatus of claim 14 wherein said third and fourth electron beam guns are aligned along a second transverse axis.

23. The apparatus of claim 14 wherein said second and fourth electron beam guns are aligned along a third longitudinal axis.

24. The apparatus of claim 16 further comprising a vertical wall within said vacuum chamber and extending between said third and fifth beams of electron particles and said fourth and sixth beams of electron particles.

25. The apparatus of claim 16 wherein said first, third and fifth electron beam guns are aligned on a second longitudinal axis and said second fourth and sixth electron beam guns are aligned along a third longitudinal axis.

26. The apparatus of claim 18 wherein said first, third, fifth and seventh electron beam guns are aligned along a second longitudinal axis and said second fourth sixth and eighth electron beam guns are aligned along a third longitudinal axis.

27. A combination electron beam furnace and shielding apparatus, said combination comprising:
 a vacuum chamber;
 a vertically extending longitudinal barrier suspended within said vacuum chamber; and
 a first transverse barrier suspended adjacent to said vertically extending longitudinal barrier and sized to extend between beams of electron particles emitted from a first pair of electron beam guns mounted to said vacuum chamber.

28. The apparatus of claim 27 further comprising a second transverse barrier suspended adjacent to said vertically extending longitudinal barrier and sized to extend between beams of electron particles emitted from a second pair of electron beam guns mounted to said vacuum chamber.

29. The apparatus of claim 27 wherein said longitudinal barrier and said first and second transverse barriers comprise planar plate members.

30. The apparatus of claim 27 wherein said first transverse barrier is centrally disposed between the two electron beam guns of the first pair of electron beam guns.

31. The apparatus of claim 28 wherein said second transverse barrier is centrally disposed between the two electron beam guns of the second pair of electron beam guns.

32. The apparatus of claim 28 wherein said longitudinal barrier is centrally disposed between the first and second pairs of electron beam guns.

33. The apparatus of claim 28 wherein said first transverse barrier is centrally disposed between the two electron beam guns comprising the first pair of electron beam guns and wherein said second transverse barrier is centrally disposed between the electron beam guns comprising the second pair of electron beam guns.

34. The apparatus of claim 27 further comprising:
 a vertically extending second longitudinal barrier suspended within said vacuum chamber; and
 a primary transverse barrier member suspended adjacent to said second vertically extending longitudinal barrier member and sized to extend between beams of electron particles emitted from a third pair of electron beam guns mounted to said vacuum chamber.

35. The apparatus of claim 34 further comprising a secondary transverse barrier member suspended adjacent to said second longitudinal barrier and sized to extend between beams of electron particles emitted from a fourth pair of electron beam guns mounted to said vacuum chamber.

36. The apparatus of claim 35 wherein said second longitudinal barrier is centrally disposed between said third and fourth pairs of electron beam guns.

37. The apparatus of claim 34 wherein said primary transverse barrier member is centrally disposed between the electron beam guns comprising the third pair of electron beam guns.

38. The apparatus of claim 35 wherein said secondary transverse barrier member is centrally disposed between the electron beam guns comprising the fourth pair of electron beam guns.

39. The apparatus of claim 35 wherein said primary transverse barrier member is centrally disposed between the electron beam guns comprising the third pair of electron beam guns and wherein said secondary transverse barrier member is centrally disposed between the electron beam guns comprising the fourth pair of electron beam guns.

40. An electron beam furnace, comprising:
 a vacuum chamber having a longitudinal axis;
 a hearth assembly within said vacuum chamber;
 a first pair of electron beam guns affixed to said vacuum chamber for projecting electron beams towards said hearth assembly;
 a second pair of electron beam guns affixed to said vacuum chamber for projecting electron beams towards said hearth assembly; and
 a vertically extending planar barrier member suspended within said vacuum chamber and extending along at least a portion of said longitudinal axis between one electron beam gun of said first pair of electron beam guns and the other electron beam gun of said first pair of electron beam guns, said vertically extending planar barrier member further extending between one electron beam gun of said second pair of electron beam guns and the other electron beam gun of said second pair of electron beam guns.

41. A shield assembly for a collection of electron beam guns, said shield assembly comprising:
 a first vertically extending longitudinal barrier;
 a first vertically extending transverse barrier attached to one side of said first vertically extending longitudinal barrier; and
 a second vertically extending transverse barrier attached to an opposite side of said first vertically extending longitudinal barrier and protruding therefrom.

42. The electron beam furnace of claim 40 further comprising:
 a first transverse barrier member supported adjacent to said longitudinal barrier and being centrally disposed between one of said electron beam guns comprising said first pair of electron beam guns and one of said electron beam guns comprising said second pair of electron beam guns; and a second transverse barrier member supported adjacent to said longitudinal barrier member and being centrally disposed between said other of said electron beam guns of said first pair of electron beam guns and said other of said electron beam guns of said second pair of electron beam guns.

43. The electron beam furnace of claim 42 wherein said first and second transverse barriers are attached to said longitudinal barrier.

44. The electron beam furnace of claim 43 wherein said vacuum chamber defines a melting zone having a first melting zone segment and a second melting zone segment and wherein said hearth assembly extends through said first and second melting zone segments and wherein said first and second pairs of electron beam guns are oriented to project electron beams on said hearth assembly within said first melting zone segment.

45. The electron beam furnace of claim 44 wherein said furnace further comprises:

a third pair of electron beam guns affixed to said vacuum chamber for projecting electron beams towards said hearth assembly within said second melting zone segment;

a fourth pair of electron beam guns affixed to said vacuum chamber for projecting electron beams towards said hearth assembly within said second melting zone segment; and a second longitudinal barrier suspended within said second melting zone segment between one of said electron beam guns of said third pair of electron beam guns and the other one of said electron beam guns of said third pair of said electron beam guns, said second longitudinal barrier extending between one of said electron beam guns of said fourth pair of electron beam guns and the other of said electron beam guns of said fourth pair of electron beam guns.

46. The electron beam furnace of claim 45 further comprising:

a primary transverse barrier member affixed to said second longitudinal barrier and being centrally disposed between said one of said electron beam guns of said third pair of electron beam guns and said one of said electron beam guns of said fourth pair of electron beam guns; and a secondary transverse barrier member affixed to said second longitudinal barrier member and being centrally disposed between said other electron beam guns of said third pair of electron beam guns and said other electron beam gun of said fourth pair of electron beam guns.

47. A method for limiting interaction between electron beams generated by at least three electron beam guns within a vacuum chamber of an electron beam furnace, comprising:

suspending a vertically extending longitudinal barrier from an upper portion of the vacuum chamber such that the barrier extends between the electron beams produced by two of the at least three electron beam guns; and suspending a vertically extending transverse barrier from the upper portion of the vacuum chamber such that the vertically extending transverse member extends between the electron beam of one of the two electron beam guns and the electron beam of the other electron beam gun of the at least three electron beam guns.

48. The method of claim 47 wherein said suspending the vertically extending longitudinal barrier comprises chaining a first planar barrier member to the upper portion of the vacuum chamber.

49. The method of claim 14 wherein said suspending the vertically extending longitudinal barrier comprises wiring a first planar barrier member to the upper portion of the vacuum chamber.

50. The method of claim 14 wherein said suspending the vertically extending transverse member comprises chaining a second planar barrier to the upper portion of the vacuum chamber.

51. The method of claim 14 wherein said suspending the vertically transverse member comprises wiring a second planar barrier to the upper portion of the vacuum chamber.

52. The shield assembly of claim 41 further comprising:

a second vertically extending longitudinal barrier attached to said first vertically extending longitudinal barrier;

a primary vertically extending transverse barrier attached to one side of said second vertically extending longitudinal barrier, said primary vertically extending transverse barrier substantially parallel with said first vertically extending transverse barrier; and a secondary vertically extending transverse barrier attached to an opposite side of said second vertically extending longitudinal barrier and substantially parallel with said second vertically extending transverse barrier.

* * * * *